United States Patent
Xu et al.

(10) Patent No.: US 6,861,267 B2
(45) Date of Patent: Mar. 1, 2005

(54) REDUCING SHUNTS IN MEMORIES WITH PHASE-CHANGE MATERIAL

(75) Inventors: Daniel Xu, Santa Clara, CA (US); Chien Chiang, Freemont, CA (US)

(73) Assignee: Intel Corporation, Santa Clara, CA (US)

( * ) Notice: Subject to any disclaimer, the term of this patent is extended or adjusted under 35 U.S.C. 154(b) by 559 days.

(21) Appl. No.: 09/953,833

(22) Filed: Sep. 17, 2001

(65) Prior Publication Data

US 2003/0052351 A1 Mar. 20, 2003

(51) Int. Cl.$^7$ .............................................. H01L 21/00
(52) U.S. Cl. .............................. 438/3; 438/84; 438/95; 438/102
(58) Field of Search .............................. 438/3, 84, 95, 438/102, 103

(56) References Cited

U.S. PATENT DOCUMENTS 6,545,287 B2 * 4/2003 Chiang .......................... 257/3

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS–Compatible Phase–Change Nonvolatile RAM Using NMOS Cell Transistors," presented at 2003 19$^{th}$ IEEE Non–Volatile Semiconductor Memory Workshop, Monterey, California, Feb. 26–20, 2003.

Ha, Y.H., Yi, J.H., Horii, H., Park, J.H., Joo, S.H., Park, S.O., Chung, U–In and Moon, J.T., "An Edge Contact Type Cell for Phase Change RAM Featuring Very Low Power Consumption," presented at IEEE 2003 Symposium on VLSI Technology, Kyoto, Japan, Jun. 12–14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase–change RAM Based on 0.24 mm–CMOS Technologies," presented at IEEE 2003 Symposium on VLSI Technology, Kyoto, Japan, Jun. 12–14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U–In and Moon, J.T., "A Novel Cell Technology Using N–doped GeSbTe Films for Phase Change RAM," presented at IEEE 2003 Symposium on VLSI Technology, Kyoto, Japan, Jun. 12–14, 2003.

* cited by examiner

Primary Examiner—Hsien-Ming Lee
(74) Attorney, Agent, or Firm—Trop, Pruner & Hu, P.C.

(57) ABSTRACT

A memory cell may include a phase-change material. Adhesion between the phase-change material and a dielectric or other substrate may be enhanced by using an adhesion enhancing interfacial layer. Conduction past the phase-change material through the interfacial layer may be reduced by providing a discontinuity or other feature that reduces or prevents conduction along said interfacial layer.

18 Claims, 4 Drawing Sheets

REDUCING SHUNTS IN MEMORIES WITH PHASE-CHANGE MATERIAL

BACKGROUND

This invention relates generally to memories that use phase-change materials.

Phase-change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure and the crystalline state involves a more ordered atomic structure. Generally, any phase-change material may be utilized; however, in some embodiments, however, thin-film chalcogenide alloy materials may be particularly suitable.

The phase-change may be induced reversibly. Therefore, the memory may change from the amorphous to the crystalline state and may revert back to the amorphous state thereafter or vice versa. In effect, each memory cell may be thought of as a programmable resistor, which reversibly changes between higher and lower resistance states.

In some situations, the cell may have a large number of states. That is, because each state may be distinguished by its resistance, a number of resistance determined states may be possible allowing the storage of multiple bits of data in a single cell.

A variety of phase-change alloys are known. Generally, chalcogenide alloys contain one or more elements from column VI of the periodic table. One particularly suitable group of alloys are GeSbTe alloys.

A phase-change material may be formed within a passage or pore defined through a dielectric material. The phase-change material may be coupled to contacts on either end of the passage.

One problem that arises is that the adhesion between the dielectric material and the phase-change material may be poor. One solution to this problem is to provide an interfacial layer that promotes adhesion between the dielectric material and the phase-change material. Generally, suitable interfacial layers are conductors such as titanium.

As a result of the use of conductive interfacial layers, the possibility exists of shunting current between the contacts past phase-change material through the interfacial layer. The state of the cell may be read by passing current through the cell to determine the resistance of the phase-change material. That is, current may be passed between the contacts through the phase-change material and as a result, the resistance of the phase-change material may be determined. However, if that current is shunted past the phase-change material, the resistivity of the phase-change material may be harder to determine.

Thus, there is a need for a way to form phase-change memory cells which with suitable adherence while reducing or even avoiding shunting of current around the phase-change material.

DETAILED DESCRIPTION

Figure 1:
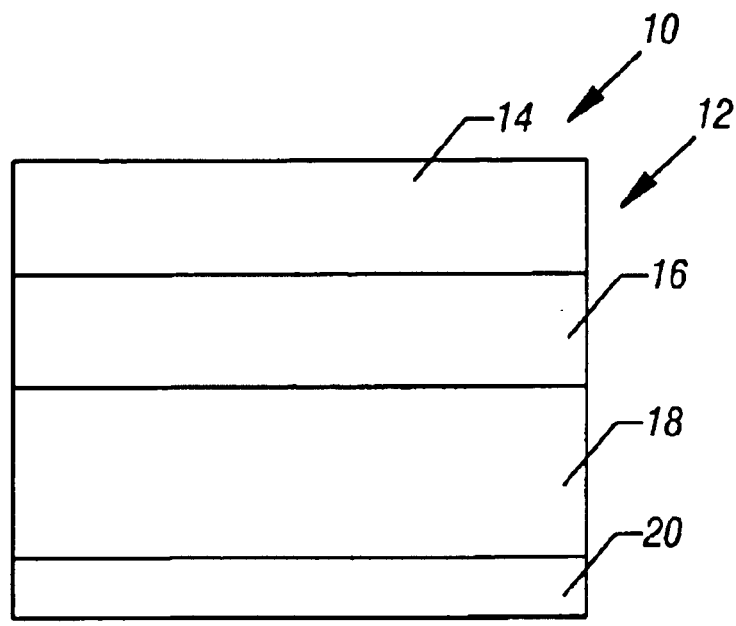
FIG. 1 is an enlarged cross-sectional view of an initial stack of layers for forming a phase-change memory cell in one embodiment of the present invention.

Referring to FIG. 1, a plurality of layers may be formed on a substrate or contact 20. The contact 20 may be cobalt silicide or any other conductive electrode in one embodiment. The contact 20 in some embodiments may be formed on still other structures. Over the contact 20 is a first dielectric layer 18. Over the first dielectric layer 18, may be a second dielectric layer 16. Over the second dielectric layer 16 may be a third dielectric layer 14 in one embodiment of the present invention. The dielectric layers 14, 16 and 18 define a dielectric 12, in accordance with one embodiment of the present invention, of a memory cell 10. In one embodiment, a nitride oxide nitride dielectric 12 may be utilized.

In accordance with one embodiment of the present invention, at least one layer of the dielectric 12 may be selectively and differentially etched. While an embodiment is shown with three layers, two or more layers may be utilized in other embodiments.

Figure 2:
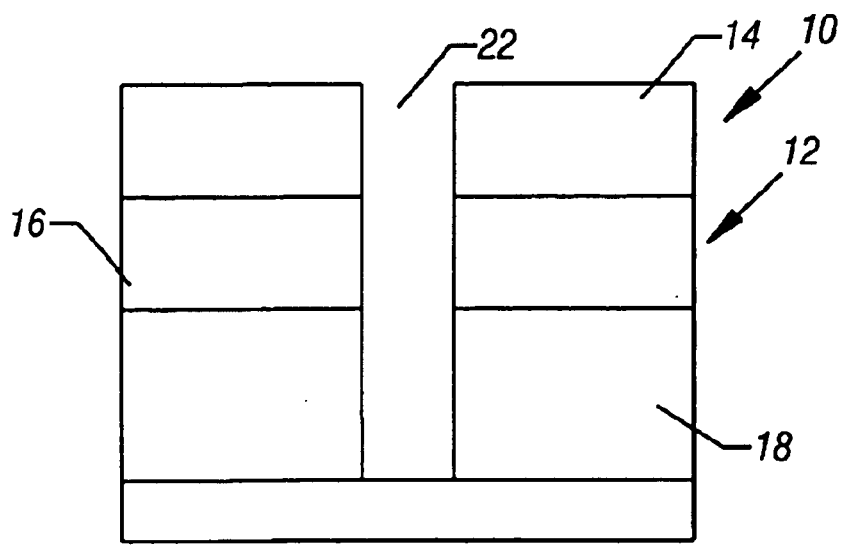
FIG. 2 is an enlarged cross-sectional view of the embodiment shown in FIG. 1 after a pore has been formed.

Referring to FIG. 2, in accordance with one embodiment of the present invention, a pore 22 may be etched, for example using a conventional anisotropic etch. The etch may form a pore with vertical sidewalls that extend through the dielectric 12 to the contact 20.

Figure 3:
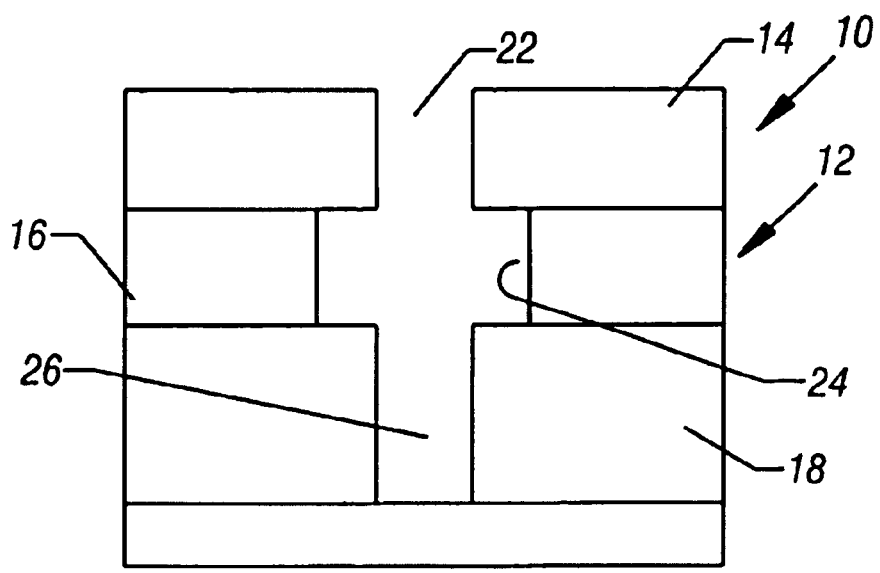
FIG. 3 is an enlarged cross-sectional view of the embodiment shown in FIG. 2 after further processing in accordance with one embodiment of the present invention.

Referring to FIG. 3, after the etch to form the pore 22, an isotropic etch may form the extension 24 that extends laterally outwardly from the pore 22 around its entire periphery. In one embodiment of the present invention, a dry or wet isotropic etch may be utilized which preferentially etches the layer 16. Thus, in an embodiment in which the layer 16 is an oxide, an etch which preferentially etches oxide and is less active with respect to the layers 14 and 18 may be utilized in accordance with one embodiment of the present invention. Advantageously, the isotropic etch is less active with respect to the contact 20 or the layers 14 and 18.

As a result, a cave-like structure may be formed wherein the third dielectric layer 18 overhangs the second dielectric layer 16.

Figure 4:
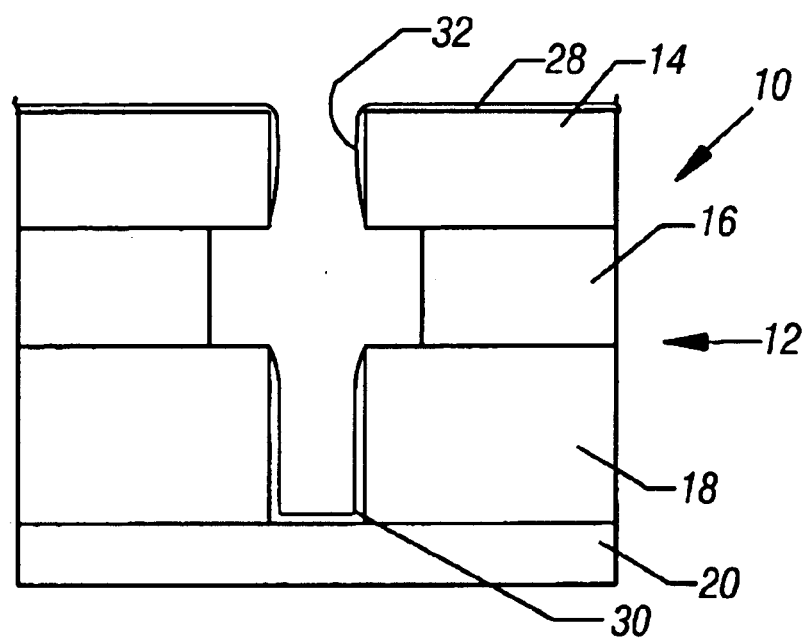
FIG. 4 is an enlarged cross-sectional view of the embodiment shown in FIG. 3 after still further processing in accordance with one embodiment of the present invention.

Turning next to FIG. 4, an interfacial layer may be deposited or otherwise formed over the dielectric 12. In one embodiment, an interfacial material may be formed or deposited on the dielectric 12 to form an upper surface 28 on the dielectric layer 18, a vertical surface 32 on the portion of the third dielectric layer 14 and a surface 30 on the contact 20 and first dielectric layer 14 forming the pore 22 walls. The vertical walls of the second dielectric layer 16 may be uncoated because of their recessed character.

As a result, an adhesion promoting interfacial layer may be defined that presents a feature, such as a discontinuity, to electrical current attempting to move vertically through the cell 10. Because of the opening or gap between the surfaces 32 and 30, current may not be conducted from the surface 30 to the surface 28, especially since the second dielectric layer 16 may be an electrical insulator. At the same time, the surfaces 28, 32, and 30 may be effective to promote adhesion of a phase-change material to the dielectric 12.

Figure 5:
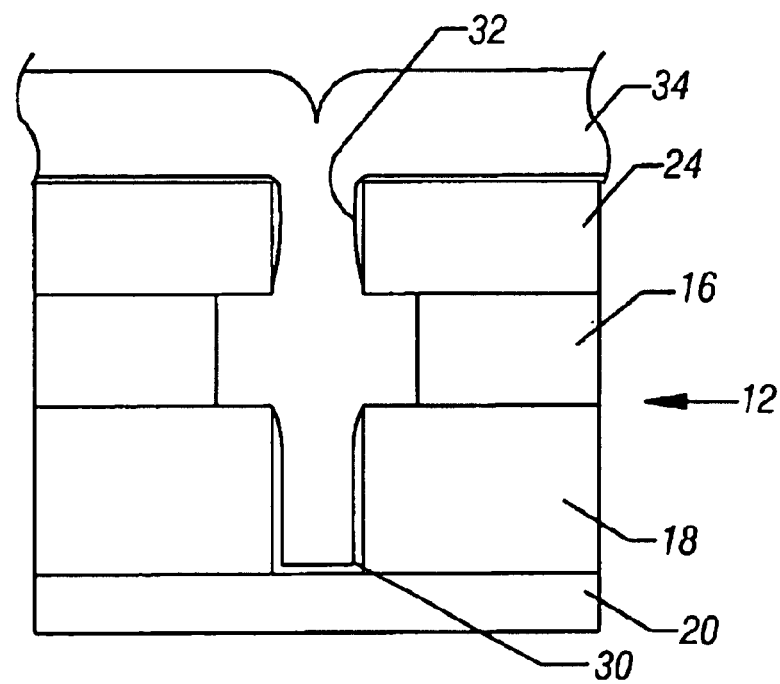
FIG. 5 is an enlarged cross-sectional view of the embodiment shown in FIG. 1 after additional processing in accordance with another embodiment of the present invention.

Thus, as shown in FIG. 5, a phase-change material 34 may be formed in the pore 22 and over an upper surface of the dielectric 12. The phase-change material 34 may be formed in any fashion including deposition. The phase-change material 34 may or may not fill the extensions 24, but generally fills the pore 22 and overflows over the surface of the upper dielectric 12. The presence of the interfacial layer made up of the surfaces 28, 30 and 32 promotes adhesion between the phase-change material 34 and the dielectric 12 as well as the contact 20.

Figure 6:
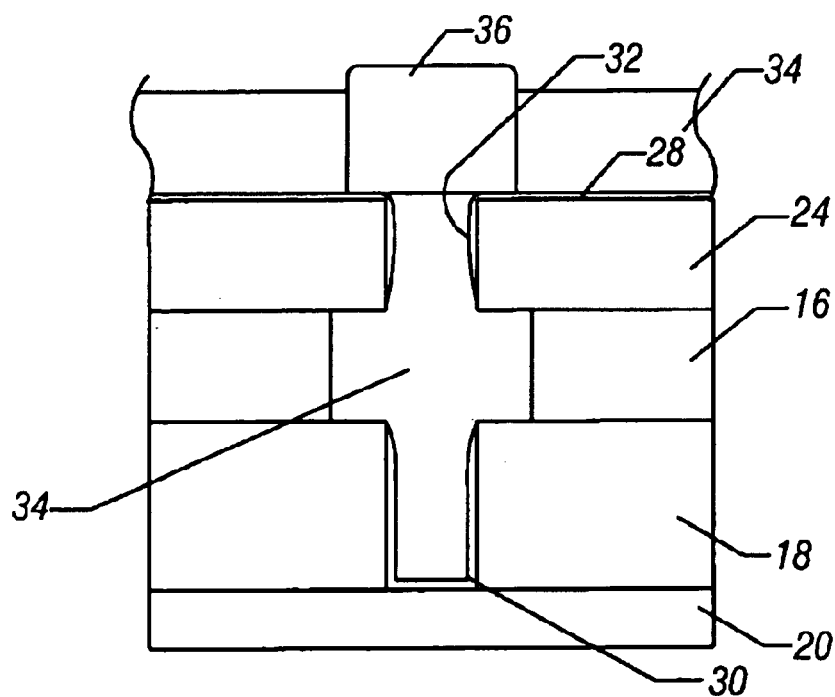
FIG. 6 is an enlarged cross-sectional view of the embodiment shown in FIG. 5 after further processing in accordance with one embodiment of the present invention.

Thereafter, as shown in FIG. 6, a contact 36 may be formed on the upper surface of the phase-change material 34. Thus, a portion of the phase-change material 34 may be sandwiched between an upper contact 36 and the contact 20. As a result, current may flow between the contacts 36 and 20. The possibility of a short or shunt that bypasses the phase-change material 34 by passing through the conductive interfacial layer is reduced or eliminated by the feature such as the discontinuity in the interfacial layer, which in one embodiment, may be the result of the lateral extension 24. Therefore, the advantages of better adhesion may be achieved without causing inadvertent shunts that may adversely affect the sensing of the state of the phase-change material 34.

Figure 7:
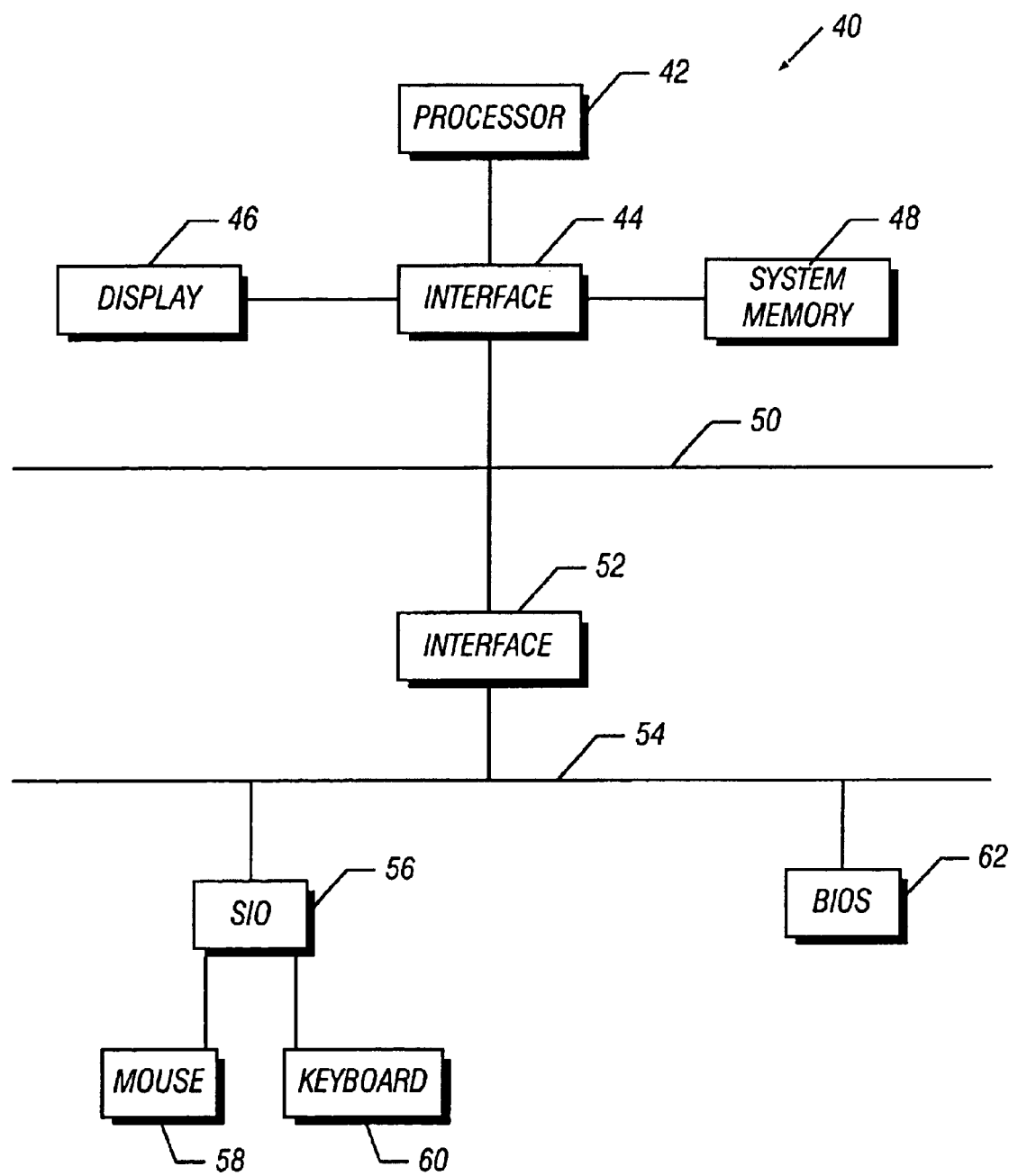
FIG. 7 is a schematic depiction of a processor-based system in accordance with one embodiment of the present invention.

Referring to FIG. 7, the memory cell shown in FIG. 6 may be replicated to form a memory array including a large number of cells. That memory may be utilized as a memory of a wide variety of processor-based systems such as the system 40 shown in FIG. 7. For example, the memory may be utilized as the system memory or other memory in a variety of personal computer products such as laptop products or desk top products or servers. Similarly, the memory may be utilized in a variety of processor-based appliances. Likewise, it may be used as memory in processor-based telephones including cellular telephones.

In general, the use of the phase-change memory may be advantageous in a number of embodiments in terms of lower cost and/or better performance. Referring to FIG. 7, the memory 48, formed according to the principles described herein, may act as a system memory. The memory 48 may be coupled to a interface 44, for instance, which in turn is coupled between a processor 42, a display 46 and a bus 50. The bus 50 in such an embodiment is coupled to an interface 52 which in turn is coupled to another bus 54.

The bus 54 may be coupled to a basic input/output system (BIOS) memory 62 and to a serial input/output (SIO) device 56. The device 56 may be coupled to a mouse 58 and a keyboard 60, for example. Of course, the architecture shown in FIG. 7 is only an example of a potential architecture that may include the memory 48 using the phase-change material.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a passage through a dielectric layer;
   covering said passage with an adhesion promoting material;
   creating an electrical discontinuity in said adhesion promoting material along said passage; and
   forming a phase-change material in said passage.

2. The method of claim 1 including forming a dielectric layer over a contact layer and forming said passage through said dielectric layer to said contact layer.

3. The method of claim 2 including covering said passage with an adhesion promoting material that is conductive.

4. The method of claim 1 wherein creating an electrical discontinuity includes forming an opening in said adhesion promoting material.

5. The method of claim 4 wherein forming a passage includes forming a dielectric having at least two discrete layers and forming the passage through said layers.

6. The method of claim 5 including forming a substantially vertically extending passage through said layers and then forming a lateral extension in said passage into one of said layers.

7. The method of claim 6 including forming said lateral extension by selectively isotropically etching one of said layers.

8. The method of claim 7 wherein forming a passage includes forming a dielectric with three layers including a middle layer.

9. The method of claim 8 including selectively isotropically etching the middle layer of said three layers.

10. A method comprising:
    forming a passage through a dielectric layer;
    covering said passage with a conductive material;
    preventing conduction along said passage via said conductive material; and
    forming a phase-change material in said passage.

11. The method of claim 10 including forming a dielectric layer over a contact layer and forming said passage through said dielectric layer to said contact layer.

12. The method of claim 11 including covering said passage with a conductive material that promotes adhesion between said phase-change material and said dielectric layer.

13. The method of claim 10 wherein preventing conduction along said passage via said conductive material includes creating an electrical discontinuity in said conductive material along said passage.

14. The method of claim 13 wherein forming a passage includes forming a dielectric having at least two discrete layers and forming said passage through said layers.

15. The method of claim 14 including forming a substantially vertically extending passage through said layers and then forming a lateral extension in said passage in one of said layers.

16. The method of claim 15 including forming said lateral extension by selectively isotropically etching one of said layers.

17. The method of claim 16 wherein forming said passage includes forming a dielectric with three layers including a middle layer.

18. The method of claim 17 including selectively isotropically etching the middle layer of said three layers.

* * * * *